United States Patent
Huang et al.

(10) Patent No.: US 8,208,321 B2
(45) Date of Patent: Jun. 26, 2012

(54) APPARATUS AND METHOD FOR DATA STROBE AND TIMING VARIATION DETECTION OF AN SDRAM INTERFACE

(75) Inventors: Ming-Chuan Huang, Zhubei (TW); Chien-Piao Lan, Hsinchu (TW); Chia Hao Lee, Tainan (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 289 days.

(21) Appl. No.: 12/656,216

(22) Filed: Jan. 21, 2010

(65) Prior Publication Data
US 2011/0019489 A1 Jan. 27, 2011

(30) Foreign Application Priority Data
Jul. 27, 2009 (TW) .............................. 98125150 A

(51) Int. Cl.
*G11C 7/00* (2006.01)
*G11C 8/00* (2006.01)
(52) U.S. Cl. ... 365/193; 365/191; 365/194; 365/189.05; 365/233.1; 365/233.11; 365/233.13
(58) Field of Classification Search .................. 365/191, 365/193, 194, 189.05, 233.13, 233.1, 233.11
See application file for complete search history.

(56) References Cited

U.S. PATENT DOCUMENTS

| | | | |
|---|---|---|---|
| 2004/0101060 A1* | 5/2004 | Simon et al. .................. 375/242 |
| 2005/0039066 A1* | 2/2005 | Simon et al. .................. 713/400 |
| 2009/0244997 A1* | 10/2009 | Searles et al. .................. 365/194 |

* cited by examiner

*Primary Examiner* — Ly D Pham
(74) *Attorney, Agent, or Firm* — Bacon&Thomas, PLLC

(57) ABSTRACT

An apparatus for data strobe and timing variation detection of an SDRAM interface includes a differential-signal to single-end signal converter, a first phase delay circuit, a data latch circuit. The differential-signal to single-end signal converter receives a differential data strobe signal from the SDRAM interface and converts the signal into a single-end data strobe signal. The first phase delay circuit is connected to the differential-signal to single-end signal converter to delay the phase of the single-end data strobe signal for producing a delayed data strobe signal. The data latch circuit is connected to the phase delay circuit to latch synchronous data from the SDRAM interface according to the delayed single-end data strobe signal.

17 Claims, 8 Drawing Sheets

APPARATUS AND METHOD FOR DATA STROBE AND TIMING VARIATION DETECTION OF AN SDRAM INTERFACE

BACKGROUND OF THE INVENTION

1. Field of the Invention

The present invention relates to the technical field of memory accesses and, more particularly, to an apparatus and method for data strobe and timing variation detection of an SDRAM interface.

2. Description of Related Art

With the rapid advance of computer systems, microcomputer systems, consumer electronics and semiconductor technologies, the audio-visual performance of electronic products has significantly developed. Therefore, the data source synchronous communication interfaces have relatively advanced. For example, the access speed of synchronous dynamic random access memory (SDRAM), such as DDR, DDR2 and DDR3, is rapidly increased to thereby provide a higher memory bandwidth. The SDRAM access speed is improved from xMHz few years ago to xGHz nowadays. Accordingly, more sophisticated mechanism, method and circuit are required for accurately reading data, and a more complete scheme is required for handling the synchronous control between chips, detecting the timing variation and performing the regulation mechanism, so as to surely obtain the system stability and reliability.

The SDRAM device is essentially used as a working memory for a computer system, and the technical feature is to use a data source synchronous interface protocol. The SDRAM data transfer is essentially relied on a common clock signal and data strobe signal (DQS) as a reference to complete the signal synchronization and the synchronous data latch and transmission.

The data strobe signal is a control signal allowing a data receiving side to latch data on a data bus. A typical way uses an internal clock of the data receiving side to pass the data strobe signal through a gated circuit to produce an effective data strobe signal, then performs a phase delay operation on the effective data strobe signal, and finally latches the data with respect to the rising edges and falling edges of the delayed data strobe signal. Typically, the data bus is an 8-bit data bus.

A system with an SDRAM device needs a memory controller to issue relative commands and data to the SDRAM device to complete a SDRAM access task. For a write command execution, the memory controller issues a serial of command (pre-charge, active and write) to the SDRAM interface and then drives the write data (DQ), differential data-strobe-signal (DQS, DQS_B) and data_mask signals (DM) to SDRAM interface. For a read command execution, the memory controller issues a serial of command (pre-charge, active and read) to the SDRAM interface, and after a plurality of clock cycles, the SDRAM device is based on the timing specification to output pairs of read data and data-strobe signals on synchronous communication interface (DQ, DQS, DQS_B).

The interface timing delay certainly occurs in a synchronous interface on physical path and operation of the high-speed data transmission interface. The timing delay is from a transistor's operation time, a transmission line's propagation/transition delay and the like. In case the phases of data strobe signal and data bus signal are same delay value and have a reference synchronous clock signal (CKP and CKN), therefore a data source synchronous interface technology can be applied to a very high speed system. In addition, for reducing the amount of synchronous interface signals as best as possible, the data strobe signal and the data bus signal are designed in bi-direction in the DDR SDRAM interface.

Upon the SDRAM interface standard, multiple control signals are used to perform the SDRAM access command operations, and the used control signals include clock (CKP & CKN), row address strobe (RAS_B), column address strobe (CAS_B), write enable (WE_B) and address bus signals.

The following is a basic operation and corresponding interface signal transmission for an SDRAM read command. The SDRAM controller first sends a read command to the SDRAM interface based on a defined timing specification. After certain clock cycles, the SDRAM device refers to the phase of a clock signal to output data on synchronous data bus signals (DQ) and data strobe signals (DQS). The data bus and data strobe signals are connected to memory controller through a PCB, to IO PADs and then to the data receiving circuit of memory controller.

A high speed system requires a quite accurate clock phase control circuit to control the phase/timing of a data strobe signal and data bus. The data receiving device necessarily estimates the arrival time of data outputted by a data transfer device for receiving the data. However, the synchronous data bus signal and the data strobe signal are sent to the corresponding pins of the data receiving device through the transmission line and to the data receiving circuit through the I/O pads. The referred clock signal for the synchronous data communication system is for the SDRAM controller and SDRAM device. The synchronous clock signal is driven by SDRAM controller and use the signal timing to output signals and expected the input signal's timing. The SDRAM device accordingly the referred clock signal to drive signals (DQ, DQS) on the SDRAM interface.

In practice, the characteristic variation of chip processing, the feature of PCB, the temperature variation of chip and system, and the voltage variation of chip and system will influence the delayed amount on signal transmission of the synchronous data interface. Accordingly, the signal cannot accurately arrive at the data receiving side on the expected time slot. Particularly, when the timing variation is overlarge, the data cannot be latched correctly at the data receiving side. The techniques to control the timing and detect and regulate the timing variation are very important mechanism for a data source synchronous interface.

The conventional skill directly uses a gated circuit to process the data strobe signal at the data receiver. The data receiving side uses the expected cycle number and phase control circuit to generate the data valid signal. The SDRAM controller will use the data valid signal to perform a signal gated/mask process on the externally coming data strobe signal for producing a safe data strobe signal without any glitch, wherein the most difficulty is to properly estimate the correct timing of the data strobe signal. When the operation speed of the synchronous signal interface increases more and more, the difficulty in properly estimating the correct timing of the valid data strobe signal is relatively increased a lot. If the possible timing variation is concurrently considered, since the time of data arrival cannot be estimated properly or the timing of the gate circuit cannot be detected and regulated effectively, the design with the conventional circuit has a glitch signal contributed to the internal data strobe signal to thereby cause an incorrect data latch.

U.S. Pat. No. 6,940,760 granted to Borkenhagen, et al. for a "Data strobe gating for source synchronous communications interface" uses a DQS gate circuit to process an externally coming data strobe signal (DQS) to thereby produce a safe DQS without any glitch. FIG. 1 shows a block diagram of an SDRAM controller 40 disclosed in the U.S. Pat. No. 6,940, 760. As shown in FIG. 1, the memory controller 40 includes a IO drive/receive circuitry 46, i.e., an SDRAM interface, to drive and receive the data, a DQS gated circuit 52 connected to the SDRAM interface 46 in order to process a data strobe signal (DQS), a DQS delay circuit 54 connected to the DQS gated circuit 52 in order to regulate the delay of the Gated_DQS from the DQS gated circuit 52, and a read dataflow block 50 connected to the DQS delay circuit 54 in order to latch data on the data bus (DQ) according to the Delayed_Gated_DQS signal. However, such a transmission interface is based on the phase of a synchronous clock signal, and its clock signal is produced by the memory controller 40 and outputted to IO drive/receive circuitry, the pads and pins of the I/O drive circuit of the memory controller 40 to SDRAM device through the PCB, pins and pads of SDRAM device and then to the internal control circuit of the SDRAM device. Finally, the internal control circuit of the SDRAM device sends the data and a data strobe signal to the IO driver/receiver circuitry 46, but the timing of which has a delay/variation compares with ideal case without physical delay and timing variation environment. Namely, the memory controller 40 uses the internal clock phase to produce the control signal for the DQS gate circuit 52, meanwhile, the read data strobe signal has a considerable time delay and phase difference with the internal clock of the memory controller 40. Therefore, such a way is unsafe for producing an effective data strobe signal to perform a data latch, and prone to producing an incorrect timing. In addition, the performance frequency of the entire system is limited by the time delay produced by the IO drive/receive circuitry and the PCB transition lines, so the system cannot be used in current and future high-speed data transmission interface.

Therefore, it is desirable to provide an improved apparatus and method to mitigate and/or obviate the aforementioned problems.

SUMMARY OF THE INVENTION

The object of the present invention is to provide an apparatus and method for data strobe and timing variation detection of an SDRAM interface, which uses differential data strobe signals to latch data from the SDRAM device, so as to latch data more accurately than the prior art without considering the delays produced by the PCB lines and the drive/receive circuit, thereby overcoming the problem that the data cannot be accurately latched in the prior art due to the timing variation of signals.

According to a feature of the invention, an apparatus for data strobe and timing variation detection of an SDRAM interface is provided. The apparatus includes a differential-signal to single-end signal converter, a first phase delay circuit and a data latch circuit. The differential-signal to single-end signal converter is connected to a synchronous transmission interface in order to receive a pair of differential data strobe signals and convert the differential data strobe signals into a single-end data strobe signal. The first phase delay circuit is connected to the differential-signal to single-end signal converter in order to regulate the single-end data strobe signal to thereby produce a delayed single-end data strobe signal. The data latch circuit is connected to the phase delay circuit in order to latch synchronous data from the synchronous transmission interface according to the delayed single-end data strobe signal (SE_DQS_DLY).

According to another feature of the invention, an SDRAM system is provided, the system includes at least one double data rate (DDR) 2/3 SDRAM device and a memory controller. The memory controller is connected to the DDR 2/3 SDRAM device for accessing data and the SDRAM devices are the temporary storage device for a computer system. The memory controller includes a differential-signal to single-end signal converter, a first phase delay circuit and a data latch circuit. The differential-signal to single-end signal converter is connected to a SDRAM interface in order to receive a pair of differential data strobe signals from the SDRAM interface and convert the pair of differential data strobe signals into a single-end data strobe signal. The first phase delay circuit is connected to the differential-signal to single-end signal converter in order to regulate the single-end data strobe signal to thereby produce a delayed single-end data strobe signal. The data latch circuit is connected to the phase delay circuit in order to latch synchronous data from the SDRAM interface according to the delayed single-end data strobe signal.

According to a further feature of the invention, a method for data strobe and timing variation detection of an SDRAM interface is provided. The method includes: (A) converting a pair of differential data strobe signals from a synchronous transmission interface into a single-end data strobe signal; (B) regulating the single-end data strobe signal to thereby produce a delayed single-end data strobe signal; (C) according to the delayed single-end data strobe signal to latch synchronous data from the synchronous transmission interface.

Other objects, advantages, and novel features of the invention will become more apparent from the following detailed description when taken in conjunction with the accompanying drawings.

DETAILED DESCRIPTION OF THE PREFERRED EMBODIMENT

An apparatus and method for data strobe and timing variation detection of an SDRAM interface according to an embodiment of the invention is applied in a double data rate (DDR) SDRAM interface and is a data transmission interface technique for data latch that uses a synchronous differential data strobe signa. For a second generation DDR SDRAM (DDR2) specification and above, using the synchronous differential data strobe signals in design is for the purpose of reducing the DQS interference to latch data on a synchronous data bus effectively and safely. The synchronous differential data strobe signal can relatively increase the signal quality, and the interface operation speed since the differential signal technique is used to transfer the data strobe signal between the memory controller chip and the SDRAM device chip.

Figure 1:
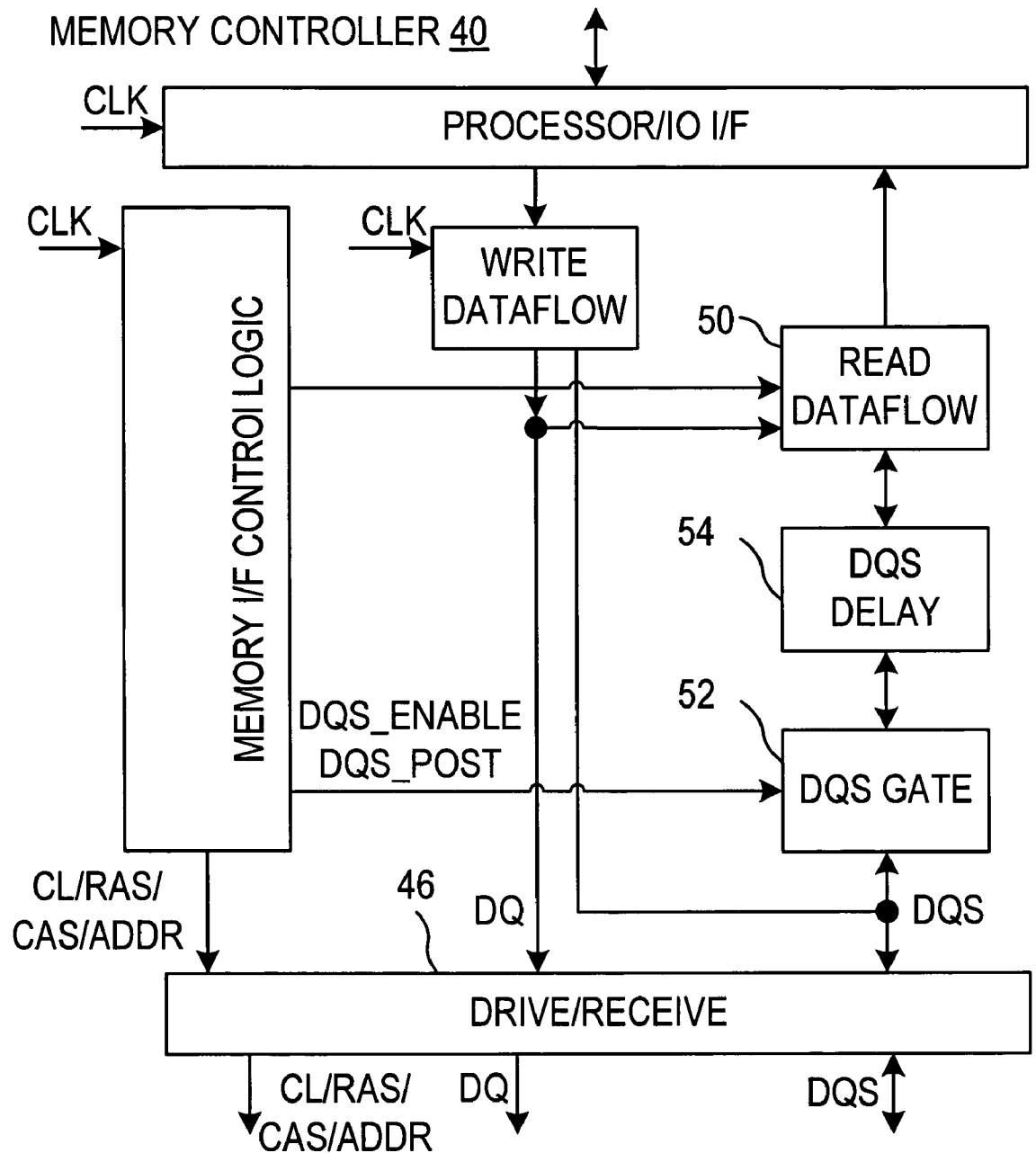
FIG. 1 is a block diagram of a typical synchronous dynamic random access memory (SDRAM) controller.
Figure 2:
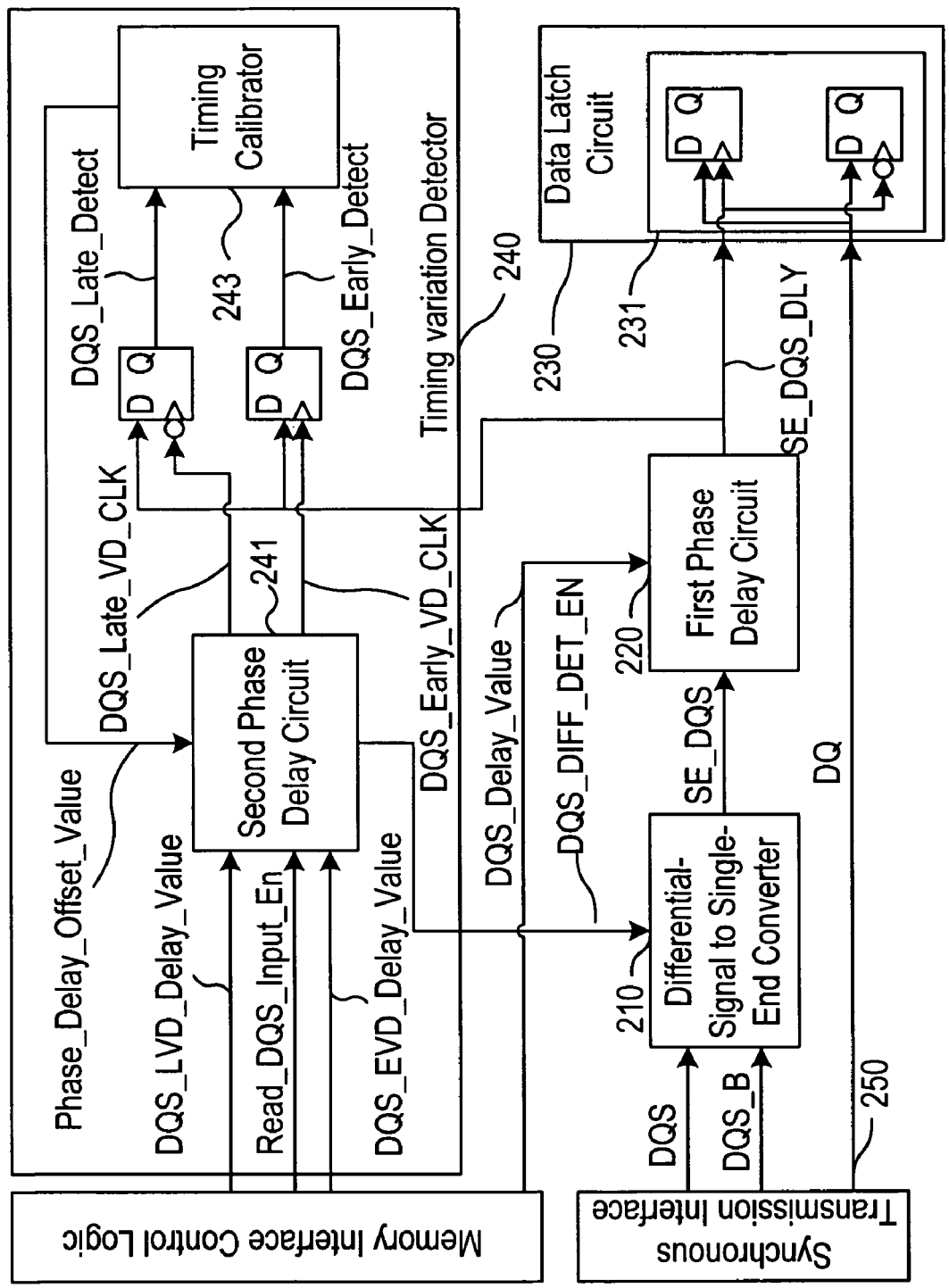
FIG. 2 is a block diagram of an apparatus for data strobe and timing variation detection of an SDRAM interface according to an embodiment of the invention.

FIG. 2 is a block diagram of an apparatus 200 for data strobe and timing variation detection of an SDRAM interface according to an embodiment of the invention. In FIG. 2, the apparatus 200 includes a differential-signal to single-end signal converter 210, a first phase delay circuit 220, a data latch circuit 230 and a timing variation detector 240.

The differential-signal to single-end signal converter 210 is connected to a synchronous transmission interface 250 in order to receive a pair of differential data strobe signals outputted by the interface 250 and convert it into a single-end data strobe signal. The interface 250 is a DDR SDRAM transmission interface.

The first phase delay circuit 220 is connected to the differential-signal to single-end signal converter 210 in order to regulate the single-end data strobe signal to thereby produce a delayed single-end data strobe signal. The delayed single-end data strobe signal has a programmable phase delay range from zero to 180 degrees.

Figure 3:
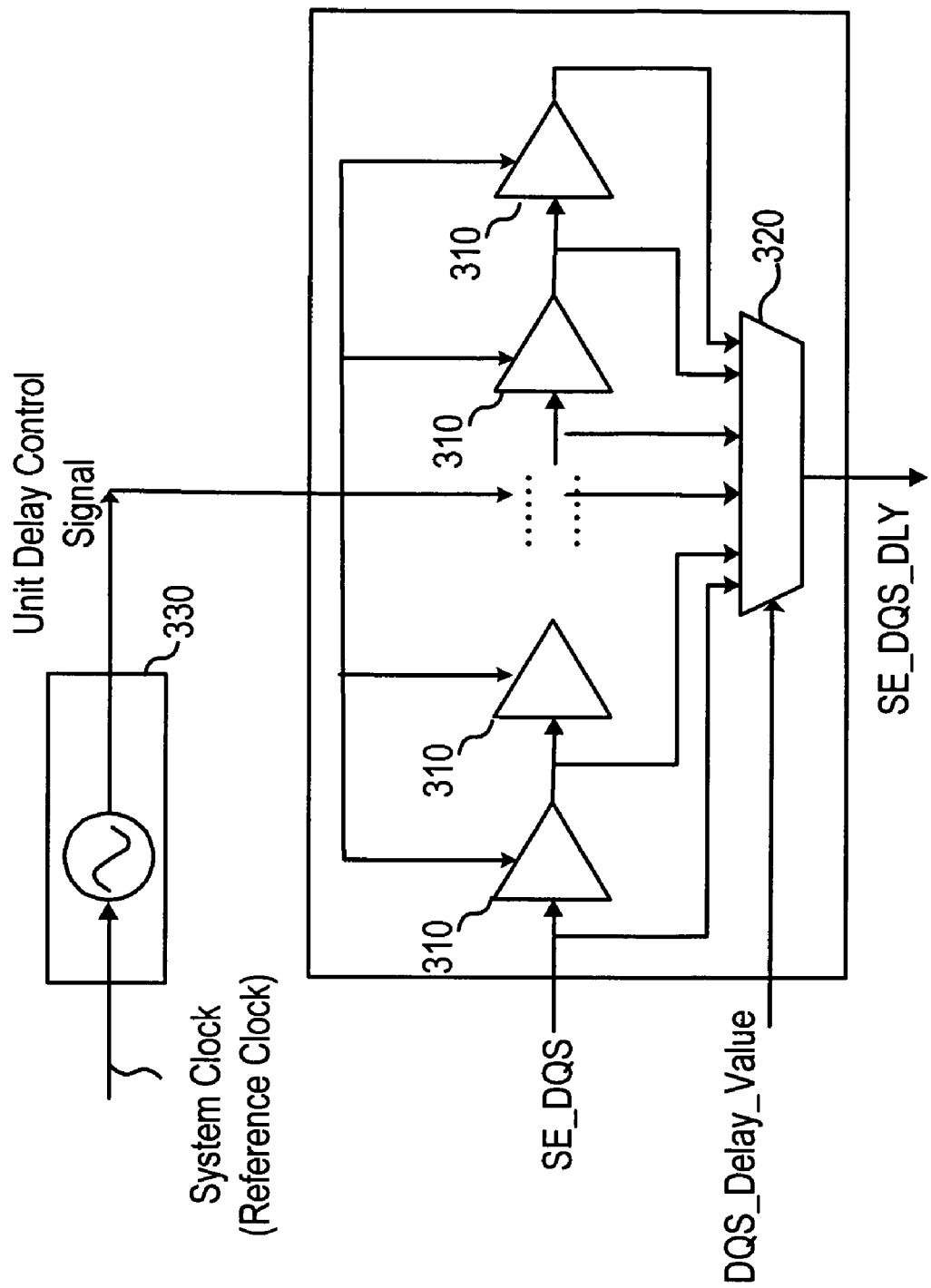
FIG. 3 is a block diagram of a first phase delay circuit according to an embodiment of the invention.

FIG. 3 is a block diagram of the first phase delay circuit 220 according to an embodiment of the invention. As shown in FIG. 3, the first phase delay circuit 220 includes multiple unit delay elements 310 and a multiplexer 320. The first phase delay circuit 220 is based on a DQS delay value DQS_Delay_Value to select a unit delay element 310 as an output to thereby produce the delayed single-end data strobe signal.

The data latch circuit 230 is connected to the phase delay circuit 220 in order to latch synchronous data DQ from the synchronous transmission interface 250 according to the delayed single-end data strobe signal. The data latch circuit 230 includes 2N first-in-first-out (FIFO) buffers 230 to temporarily store data from the synchronous transmission interface, where N is a positive integer.

The timing variation detector 240 includes a second phase delay circuit 241 and a timing calibrator 243. The second phase delay circuit 241 is based on a first estimated delay value (DQS_EVD_Delay_Value: Early Variation Detection Value) to produce an early clock strobe signal to thereby detect an early timing event present in the delayed single-end data strobe signal (SE_DQS_DLY) because of the first phase delay circuit 220. In addition, the second phase delay circuit 241 is based on a second estimated delay value (DQS_LVD_Delay_Value: Late Variation Detection Value) to produce a late clock strobe signal to thereby detect a late timing event present in the delayed single-end data strobe signal from the first phase delay circuit 220.

Figure 4:
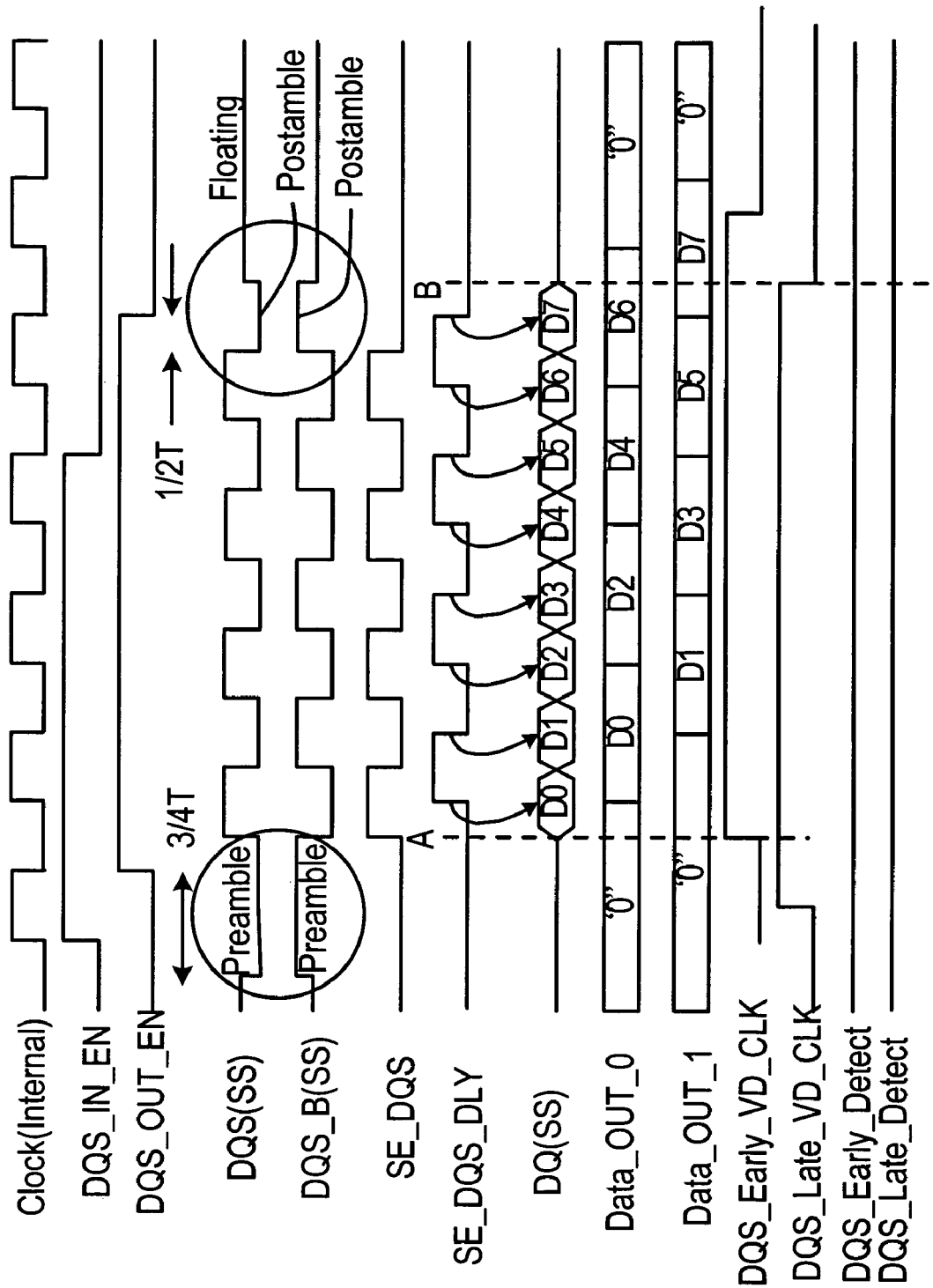
FIGS. 4-6 are schematic diagrams of signal timing according to an embodiment of the invention.
Figure 5:
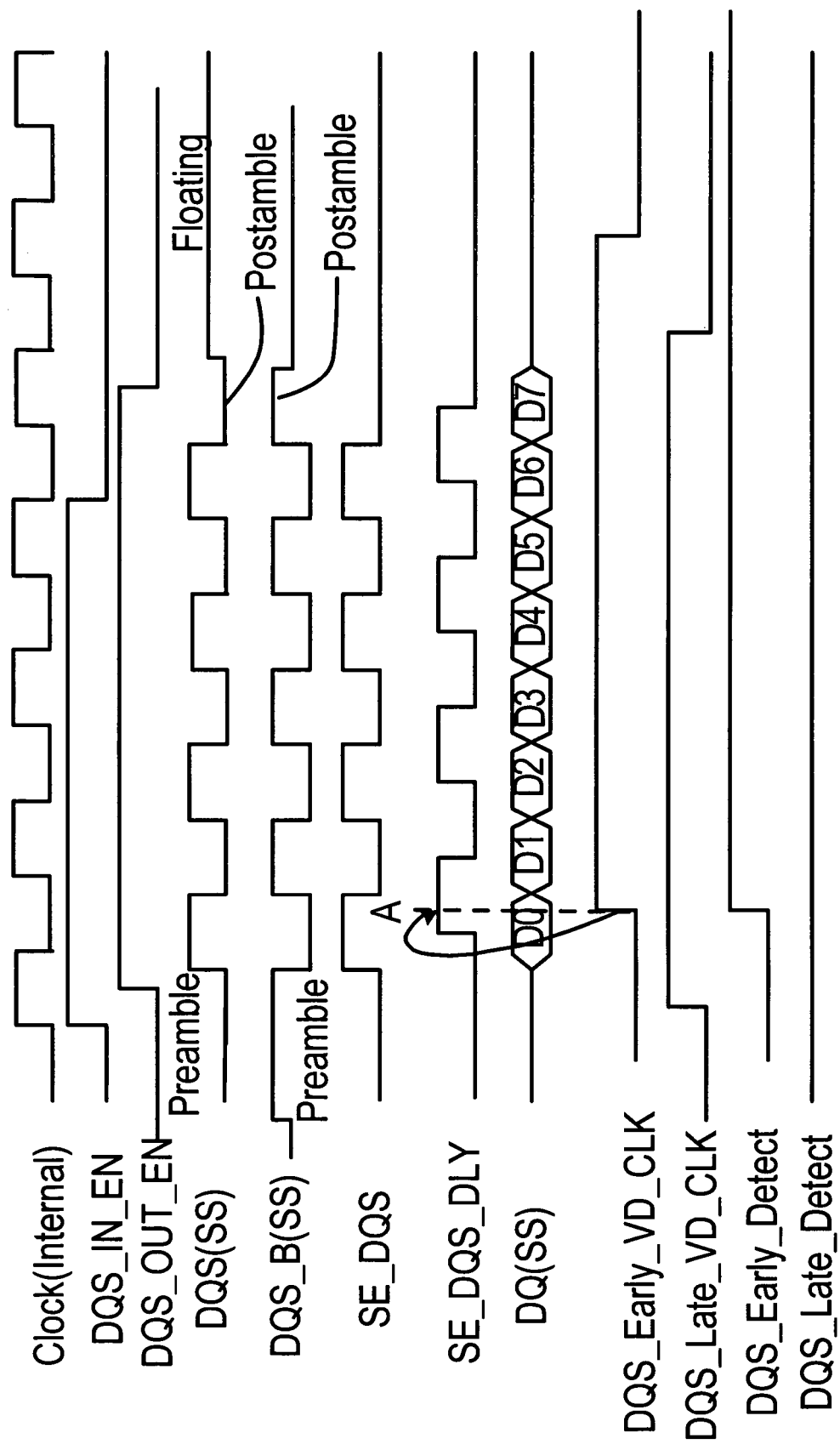
Figure 6:
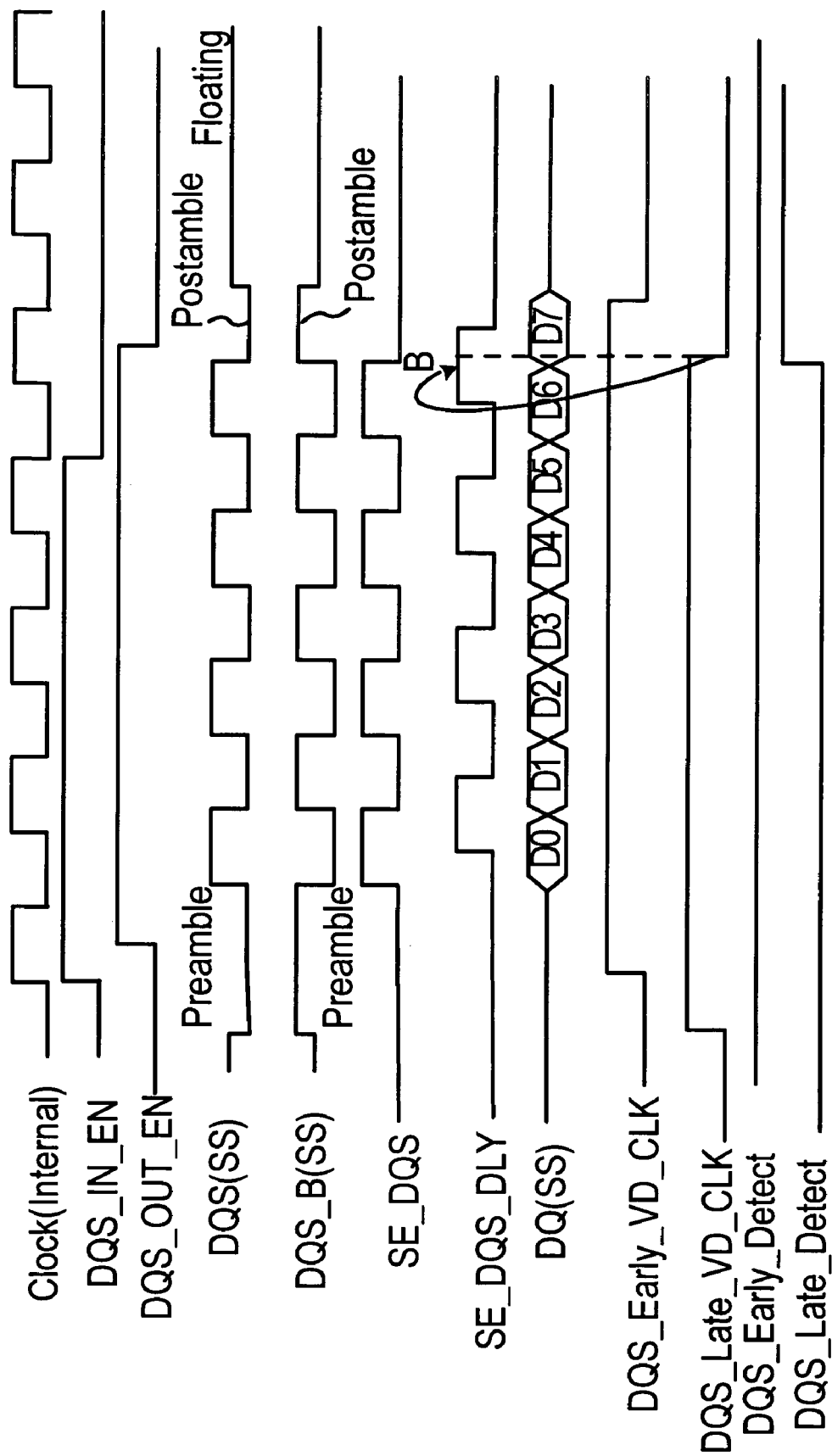

FIGS. 4-6 are schematic diagrams of signal timing according to an embodiment of the invention. As shown at position 'A' in FIG. 4, the rising edge of the early clock strobe signal DQS_Earyly_VD_CLK is used to latch the delayed single-end data strobe signal SE_DQS_DLY. When the delayed single-end data strobe signal SE_DQS_DLY is at a low voltage (logic 0), it indicates that there is no early timing variation event, and in this case the early timing detection signal DQS_Early_Detected is at a low voltage. As shown at position 'A' in FIG. 5, when the delayed single-end data strobe signal SE_DQS_DLY is at a high voltage (logic 1), it indicates that an early timing variation event occurs, and in this case the early variation timing detection signal DQS_Early_Detected is at a high voltage.

Similarly, as shown at position 'B' in FIG. 4, the falling edge of the late clock strobe signal DQS_Late_VD_CLK is used to latch the delayed single-end data strobe signal SE_DQS_DLY. When the delayed single-end data strobe signal SE_DQS_DLY is at a low voltage (logic 0), it indicates that there is no late timing variation event, and in this case the late timing variation detection signal DQS_Late_Detected is at a low voltage. As shown at B in FIG. 6, when the delayed single-end data strobe signal SE_DQS_DLY is at a high voltage (logic 1), it indicates that a late timing variation event occurs, and in this case the late timing variation detection signal DQS_Late_Detected is at a high voltage.

The timing calibrator 243 is based on the early timing detection signal DQS_Early_Detected and the late timing detection signal DQS_Late_Detected to produce a timing variation detection signal Variation_Detected_Signal. In addition, the timing calibrator 243 is based on the first estimated delay value DQS_EVD_Delay_Value and the second estimated delay value DQS_LVD_Delay_Value to produce a phase delay offset value Phase_Delay_Offset_Value to the second phase delay circuit 241 to adjust the enable range/time slot of the differential data strobe enable signal (DIFF_DQS_DET_EN) to the differential-signal to single-end signal converter 210, so as to regulate the enable time of the differential-signal to single-end signal converter 210.

The synchronous transmission interface 250 has a synchronous clock signal which is outputted from the memory controller chip to the SDRAM device. The memory controller chip and the SDRAM device use the clock signal as a common reference clock to operate the control signal the data bus signal, data strobe signals. For a data write operation, the SDRAM controller is based on the specified timing to issue relative command and address on command and address bus. And then, controller send the data to the data bus and differential data strobe signal to SDRAM interface according to the defined clock cycle and signal timing. Accordingly, the SDRAM device uses the differential data strobe signal to latch the data on the data bus and then write them to the internal memory cell. For a write operation, the timing of the differential data strobe signal and the synchronous data bus is accurately regulated by the SDRAM controller when the signals are outputted, so the data on the synchronous data bus can be latched by the differential data strobe signal directly.

For an SDRAM read command operation, the differential data strobe signal and the read data on data bus are at same phase. Namely, the timing of the differential data strobe signal and the synchronous data bus is not regulated to an appropriate position. In this case, the SDRAM controller cannot use the differential data strobe signal directly to latch the data on the synchronous data bus.

The SDRAM controller in the prior art performs a gated/mask process directly on the differential data strobe signal and produces an effective data strobe signal through a timing regulator to latch the data from the synchronous data bus and then send the data to the interior of the chip.

As show at the circles of FIG. 4, the differential data strobe signal has one clock cycle for a preamble to indicate the start of a read data timing and one half clock cycle for a postamble to indicate the end of the command data timing. However, one clock cycle defined by a current SDRAM specification at operation is advanced from several 10 nano-second few years ago to less than one nanosecond nowadays. Accordingly, how to accurately control an interface timing becomes the most important key.

Therefore, the invention is to accurately produce an effective data strobe signal to latch the data from the SDRAM interface. When there is no data transfer, the internal data strobe signal SE_DQS can be maintained automatically at logic 0, without producing a glitch and latching an undesired data.

When a data read operation is performed on the SDRAM, the SDRAM controller is based on a number of SDRAM read data latency cycles and the latency amount of timing produced by the transmission interface to control the corresponding circuits and interfaces.

In this embodiment, a single-end data strobe signal is produced by the enable control signal (DQS_DIFF_DET_EN) to enable of the differential DQS input detector circuit and converter (differential-signal to single-end signal converter 210).

The single-end data strobe signal is moved to a best timing position, such as a 90-degree phase delay, through the programmed control of the first phase delay circuit 220 to obtain the largest data window. Namely, it is known in FIG. 4 that the positive and negative edges of the delayed single-end data strobe signal SE_DQS_DLY position at the middle point of the data window on the synchronous data bus (DQ), and in this case the synchronous data bus is latched with the most stable and safe condition.

The data latch circuit 230 uses the positive edges of the delayed single-end data strobe signal to latch odd data on the data bus and the negative edges to latch even data. Next, the latched data is stored in the internal register of the data latch circuit.

The first phase delay circuit 220 uses a system clock as an input signal, and the clock signal is converted into different value of current source outputs 330. The current outputs are connected to a unit delay element 310 to output different time delays. The delayed phase of an output signal of the unit delay element 310 is based on a different current value for different delay. Multiple unit delay elements 310 can be connected in series to obtain a greater phase delay. The various signal phase delays are selected by setting the respective delayed phases of the data strobe signal. For example, if the current system operation frequency is at 400 MHz (2.5 ns) and the delayed phase of the signal is set to 90 degrees, the timing of the signal delay is 0.625 ns. If the current system operation frequency is at 200 MHz (5 ns) and the delayed phase of the signal is set to 90 degrees, the timing of the signal delay is 1.25 ns.

Due to the PCB or other factors, the DQS signal is normally at high impedance state for no device driven condition (non-data read or data write). However, the differential DQS is possibly detected due to an unstable voltage or signal noise and cross-talk. On considering the security, an enable signal DQS_DIFF_DET_EN is designed to regulate the start and end time points for enabling the differential-signal to single-end signal converter 210. The control signal (DQS_DIFF_DET_EN) to enable the converter 210 is obtained by the SDRAM controller that is based on a number of delayed cycles of a read data latency (RL/CL) after issuing a read command. The cycle number is defined by specification and SDRAM controller will set it by the SDRAM power on initial task. The SDRAM controller produces an enable signal Read_DQS_Input_EN to the Second Phase Delay Circuit 241. The converter 210 is enabled only when a data input in a read data phase range occurs (DQS_DIFF_DET_EN). The single-end data strobe signal is maintained at logic 0 when the DQS_DIFF_DET_EN signal is not enabled or differential data strobe signal input is not detected, thereby eliminating all undesired glitch.

The data burst length of read command is fixed by each read SDRAM command, so the number of required cycles can be accurately obtained on the enable signal (Read_DQS_Input_EN). As shown in FIG. 4, the best timing position of the DQS_DIFF_DET_EN three fourth ($3/4$) of the preamble region and one half ($1/2$) of the postamble region of the differential data strobe signals (DQS, DQS_B). In the SDRAM interface specification can have a possible timing variation up to one third cycle of the reference clock ($1/3$T) on data strobe signal and data bus signal. In addition, an SDRAM controller requires the capability of detecting the timing variation and controlling the timing variation to maintain in a range for allowing the SDRAM controller chip to have an accurate data transfer.

The invention can use a programmable phase delay circuit to shift the enable timing/range of the differential-signal to single-end converter. In addition, a dynamic timing shift mechanism is applied to the enable control signal for a DQS timing variation case which has early or late timing variation detections.

When the early timing variation is programmed and enabled, a timing movement is performed on the data strobe enable control signal (Read_DQS_Input_EN) to produce an early clock strobe signal (DQS_Early_VD_CLK) to latch the delayed single-end data strobe signal (SE_DQS_DLY). When the delayed single-end data strobe signal is latched to logic 1 by rising-edge of DQS_Early_VD_CLK signal, it indicates that the early variation amount of the data strobe signal is up to an estimated variation amount. For example, the estimated variation amount is set to one eighth ($1/8$) of one clock cycle in this case.

Similarly, when the late timing variation is programmed and enabled, a late clock strobe signal is produced to latch the delayed single-end data strobe signal (SE_DQS_DLY). When the delayed single-end data strobe signal is latched to logic 1 by the falling edge of DQS_Late_VD_CLK signal, it indicates that the late variation amount of the data strobe signal is up to an estimated variation amount. For example, the estimated variation amount is set to one eighth ($1/8$) of one clock cycle in this case.

Thus, by means of the early and late timing variation detections, a timing variation event present in the SDRAM interface can be detected effectively in early phases. A stable system can effectively detect and quickly regulate a timing variation to thereby maintain the system at a reliable state for making sure the accuracy of data transmission and the reliability of system operation. However, a timing variation may originates from many factors, and its processing mechanism can be accordingly different. The processing mechanism includes, for example, reducing the system operation amount, reducing SDRAM interface operation amount, reducing system operation frequency, and increasing the system operation voltage.

For some operation modes in which reducing the power consumption is required, the SDRAM operation speed can be set to a lower speed. However, when the speed is too low (out of SDRAM specification), the timing of the differential data strobe signal outputted by the SDRAM is incorrect. The data can be accurately written in and read out to/from the SDRAM in such a mode, but the operation speed is relatively slower (with a larger data window). Therefore, an internal clock signal of the SDRAM controller can be selected to produce an input signal similar to the differential data strobe signal to the differential-signal to single-end signal converter 210. Next, the delayed single-end data strobe signal is produced through the converter 210 and the first phase delay circuit 220, and the data is properly latched by the delayed single-end data strobe signal (SE_DQS_DLY) is moved appropriately.

Figure 7:
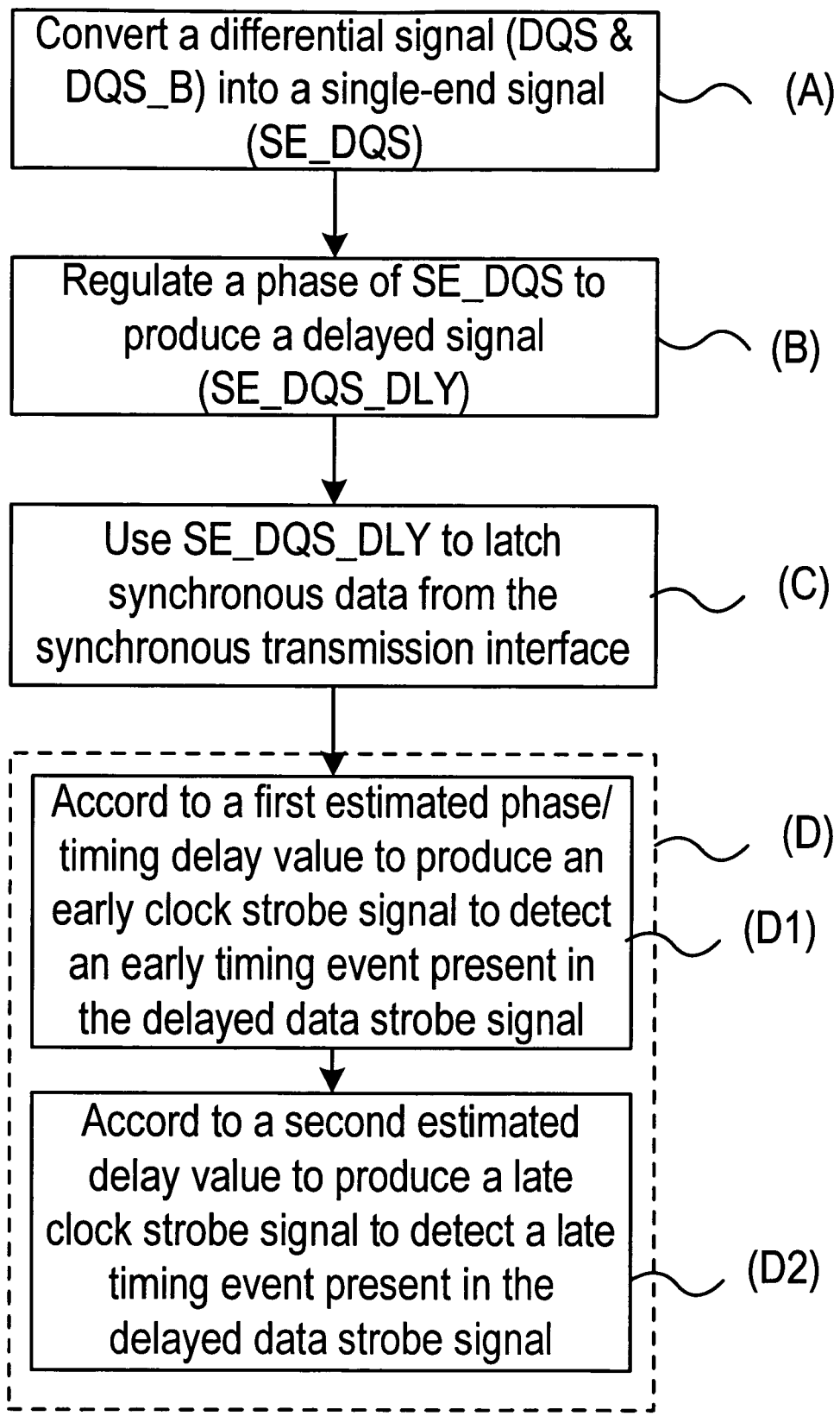
FIG. 7 is a flowchart of a method for data strobe and timing variation detection of an SDRAM interface according to an embodiment of the invention.

FIG. 7 is a flowchart of a method for data strobe and timing variation detection of an SDRAM interface according to an embodiment of the invention. As shown in FIG. 7, the method is applied to a memory controller for reading and latching data from an SDRAM device, and includes the steps: (A) converting a differential signal into a single-end signal, which converts a pair of differential data strobe signal outputted into a single-end data strobe signal. The synchronous transmission interface can be a double data rate (DDR) SDRAM.

Step (B) performs a phase delay operation on the single-end data strobe signal to produce the delayed single-end data strobe signal. The phase delay in step (B) ranges from zero to 180 degrees.

Step (C) uses the delayed single-end data strobe signal to latch synchronous data from the synchronous transmission interface.

Step (D) detects and calibrates the variation amount between the timing of the synchronous transmission interface and the internal timing of the memory controller chip, and further includes steps (D1) and (D2). Step (D1) is based on a first estimated delay value DQS_EVD_Delay_Value to produce an early clock strobe signal DQS_Early_VD_CLK to thereby detect an early timing event present in the delayed single-end data strobe signal SE_DQS_DLY. Step (D2) is based on a second estimated delay value DQS_VLD_Delay_Value to produce a late strobe clock signal DQS_Late_VD_CLK to thereby detect a late timing event present in the delayed single-end data strobe signal SE_DQS_DLY.

Figure 8:
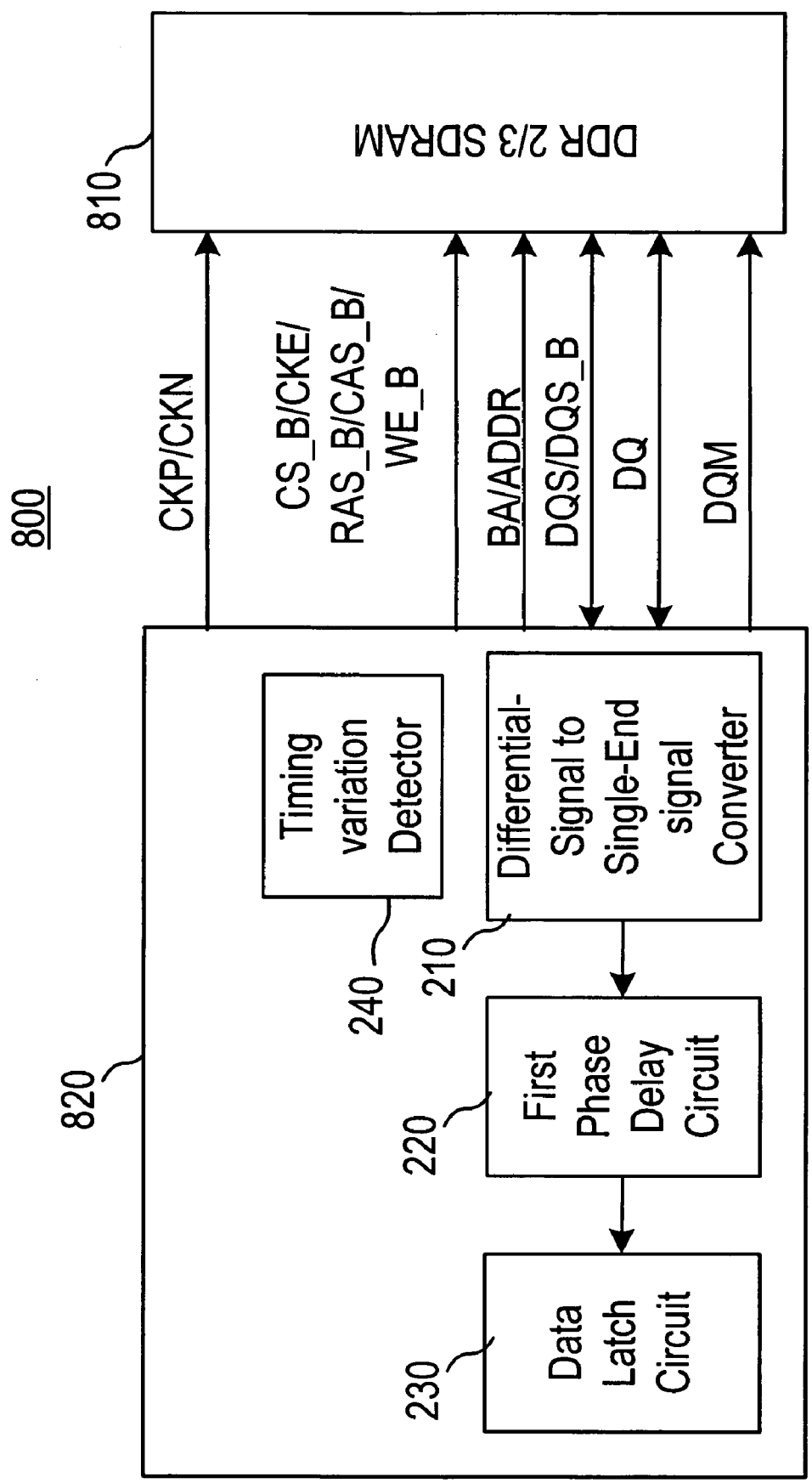
FIG. 8 is a schematic diagram of an SDRAM system with an apparatus for data strobe and timing variation detection of an SDRAM interface according to an embodiment of the invention.

FIG. 8 is a schematic diagram of an SDRAM system 800 with an apparatus 200 for data strobe and timing variation detection mechanism for an SDRAM interface according to an embodiment of the invention.

The SDRAM system 800 includes at least one double data rate (DDR) 2/3 SDRAM device 810 and a memory controller 820.

The DDR 2/3 SDRAM devices 810 are the temporarily data storage device in a computer system.

The memory controller 820 is connected to the DDR 2/3 SDRAM device 810 for accessing data on SDRAM device. The memory controller 820 includes a differential-signal to single-end signal converter 210, a first phase delay circuit 220, a data latch circuit 230 and a timing variation detector 240.

The differential-signal to single-end signal converter 210 is connected to a DDR SDRAM transmission interface in order to receive a differential data strobe signal outputted by the DDR SDRAM transmission interface and convert the differential data strobe signal into a single-end data strobe signal.

The first phase delay circuit 220 is connected to the differential-signal to single-end signal converter 210 in order to regulate the single-end data strobe signal to thereby produce a delayed single-end data strobe signal.

The data latch circuit 230 is connected to the phase delay circuit 220 in order to latch synchronous data from the DDR SDRAM interface according to the delayed single-end data strobe signal.

The timing variation detector 240 detects and calibrates a calibration mechanism of variation between the timing of the DDR SDRAM interface and the internal timing of the memory controller chip.

As cited, the prior art neither considers the signal delays caused by the transmission lines, the IO drive circuits, voltage variation and temperature variation and the device characteristic, nor considers a certain amount of timing variation present in synchronous data and synchronous data strobe signal outputted by an SDRAM. Thus, the timing for the synchronous interface is interfered completely and has an offset. In this case, when a data read operation is based only on the timing defined by the SDRAM specification without the timing variation adjustment mechanism, such an access can cause a data read mistake under higher operation speed or worst operating condition. By contrast, the invention uses the differential data strobe signal outputted by the SDRAM to latch the synchronous data from the SDRAM interface. Such a way has no need to consider the timing delay produced by the transmission lines and the IO drive circuits. In addition, with the certain amount of timing variation present in synchronous data and synchronous data strobe signal outputted by the SDRAM, the invention can latch the data from the synchronous transmission interface more accurate than the prior art. Further, by considering the timing variation of the SDRAM interface in a practical transmission, the corresponding phase delay detection and timing variation calibration can be operated more accurately than the prior art, so the data from the synchronous transmission interface is latched accurately to thereby obtain a better system reliability.

Although the present invention has been explained in relation to its preferred embodiment, it is to be understood that many other possible modifications and variations can be made without departing from the spirit and scope of the invention as hereinafter claimed.

What is claimed is:

1. An apparatus for data strobe and timing variation detection of an SDRAM interface, comprising:
   a differential-signal to single-end signal converter connected to a synchronous transmission interface for receiving a pair of differential data strobe signals and converting the differential data strobe signal into a single-end data strobe signal;
   a first phase delay circuit connected to the differential-signal to single-end signal converter for regulating the single-end data strobe signal to produce a delayed single-end data strobe signal;
   a data latch circuit connected to the phase delay circuit for latching synchronous data from the synchronous transmission interface by the delayed single-end data strobe signal; and
   a timing variation detector for detecting and calibrating a variation amount between a timing of the synchronous transmission interface and an internal timing of a memory controller chip.

2. The apparatus as claimed in claim 1, wherein the first phase delay circuit has a phase delay ranging from zero to 180 degrees.

3. The apparatus as claimed in claim 1, wherein the timing variation detector comprises a second phase delay circuit to produce an early clock strobe signal for detecting an early timing variation event present in the delayed single-end data strobe signal.

4. The apparatus as claimed in claim 1, wherein the timing variation detector comprises a second phase delay circuit to produce a late clock strobe signal for detecting a late timing variation event present in the delayed single-end data strobe signal because of the first phase delay circuit.

5. The apparatus as claimed in claim 1, wherein the data latch circuit comprises 2N First-In-First-Out buffers to temporarily store data sent by the synchronous transmission interface, where N is a positive integer.

6. The apparatus as claimed in claim 1, wherein the synchronous transmission interface is a double data rate (DDR) SDRAM transmission interface.

7. An SDRAM system, comprising:
   a DDR 2/3 SDRAM for temporarily storing data; and
   a memory controller connected to the DDR 2/3 SDRAM for accessing data, the memory controller including:
   a differential-signal to single-end signal converter connected to a transmission interface for receiving a pair of differential data strobe signals outputted by the transmission interface and converting the differential data strobe signal into a single-end data strobe signal;
   a first phase delay circuit connected to the differential-signal to single-end signal converter for regulating the single-end data strobe signal to produce a delayed single-end data strobe signal;

a data latch circuit connected to the phase delay circuit for latching synchronous data from the transmission interface according to the delayed single-end data strobe signal; and a timing variation detector for detecting and calibrating a variation amount between a timing of the synchronous transmission interface and an internal timing of a memory controller chip.

8. The system as claimed in claim 7, wherein the first phase delay circuit has a phase delay ranging from zero to 180 degrees.

9. The system as claimed in claim 7, wherein the timing variation detector comprises a second phase delay circuit to produce an early clock strobe signal to thereby detect an early timing variation event present in the delayed single-end data strobe signal.

10. The system as claimed in claim 7, wherein the timing variation detector comprises a second phase delay circuit to produce a late clock strobe signal for detecting a late timing variation event present in the delayed single-end data strobe signal.

11. The system as claimed in claim 7, wherein the data latch circuit comprises 2N First-In-First-Out buffers to temporarily store data sent by the synchronous transmission interface, where N is a positive integer.

12. The system as claimed in claim 7, wherein a delay locked loop of the DDR 2/3 SDRAM is disabled when an operation speed of the DDR 2/3 SDRAM is too low.

13. A method for data strobe and timing variation detection of an SDRAM interface, comprising the steps of:
   (A) converting a pair of differential data strobe signals outputted into a single-end data strobe signal;
   (B) regulating the single-end data strobe signal to produce a delayed single-end data strobe signal;
   (C) latching synchronous data from the synchronous transmission interface according to the delayed single-end data strobe signal; and
   (D) detecting and calibrating a timing variation amount on the synchronous transmission interface and the internal timing of a memory controller chip.

14. The method as claimed in claim 13, wherein a phase delay of zero to 180 degrees is performed in the step (B).

15. The method as claimed in claim 13, wherein the step (D) further comprises a step of:
   (D1) producing an early clock strobe signal to detect an early timing variation event present in the delayed single-end data strobe signal.

16. The method as claimed in claim 13, wherein the step (D) further comprises a step of:
   (D2) producing a late clock strobe signal based on a second estimated delay value to detect a late timing variation event present in the delayed single-end data strobe signal.

17. The method as claimed in claim 13, wherein the synchronous transmission interface is a DDR 2/3/4 SDRAM transmission interface.

* * * * *